SEMICONDUCTOR DEVICE

Filed Jan. 16, 1961 2 Sheets-Sheet 1

INVENTORS J. H. FORSTER
J. F. GRANDNER
BY H. W. Lockhart
ATTORNEY

Dec. 31, 1963 J. H. FORSTER ETAL 3,116,443

SEMICONDUCTOR DEVICE

Filed Jan. 16, 1961 2 Sheets-Sheet 2

INVENTORS J. H. FORSTER
J. F. GRANDNER

BY H W Lockhart

ATTORNEY 3,116,443
Patented Dec. 31, 1963

3,116,443

SEMICONDUCTOR DEVICE

John H. Forster, Warren Township, Somerset County, and John F. Grandner, Fanwood, N.J., assignors to Bell Telephone Laboratories, Incorporated, New York, N.Y., a corporation of New York Filed Jan. 16, 1961, Ser. No. 82,895
10 Claims. (Cl. 317—234)

This invention relates to semiconductor devices and, more particularly, to an encapsulation arrangement utilizing the semiconductor material itself as the enclosure for use in such devices.

This invention is directed particularly to two-terminal semiconductor devices which include diffused p-n junctions. It is well known that the exposed boundaries of such p-n junctions are extremely sensitive to environmental conditions, and it has become the general practice to provide protection in the form of controlled ambients of coatings. In order to provide this protection for semiconductor p-n junction devices, commercial development has led to the provision of costly and complex housings or enclosures which thereby prevent a full realization of the inherent advantages of semiconductor devices. There have been suggestions previously, for example, in the application of E. I. Doucette and R. M. Ryder, Serial No. 791,934, filed February 9, 1959, now Patent No. 3,059,158, granted October 16, 1962, for making partial use of the semiconductor material itself as an integral part of the encapsulation. However, even in the structures disclosed in the above-identified application there are complexities in regard to attachment of external leads and the use of metal part members which increase the cost and the fabrication effort for such devices.

It is therefore an object of this invention to provide an improved encapsulataion for semiconductor devices by using the semiconductor material itself as the major portion of the encapsulation. In particular, it is an object of the invention to simplify, cheapen, and reduce the size of semiconductor p-n junction devices, and at the same time improve their reliability.

An ancillary object is to reduce the number of parts used in the semiconductor p-n junction device and also to reduce the fabricataion time, in a structure which enables improved thermal dissipation.

In a basic form of this invention a wafer and a cap member both of the same semiconductor material are sealed in face-to-face relation with a ring of hard glass sandwiched between the two semiconductor pieces. On the inner face of the wafer and enclosed within the glass ring or washer is a mesa or raised portion of semiconductor material which contains a p-n junction. Contact is made between the wafer and the cap member through metal ohmic electrodes on the top surface of the mesa and the inner face of the cap member. Advantageously, this contact is an alloyed bond produced by the final sealing heat treatment. Similarly, metal ohmic electrodes are applied to the outer faces of the wafer and the cap member for making external ohmic contact to the device. It will be appreciated that p-n junction devices may be made in extremely small sizes which are comparable to the dimensions of the head of an ordinary straight pin. In fact, where this structure is used for very small area p-n junction diodes suitable for use in electronic computers, they are commonly being termed "pin-head diodes."

Accordingly, a feature of this invention is a semiconductor p-n junction device which may comprise as few as three parts, namely, a semiconductor wafer, a semiconductor cap member, and a small ring of vitreous material such as hard glass. Another feature of this assembly is the incorporation of a glass-to-semiconductor seal resulting in an hermetic encapsulation.

Another feature of this invention is the final heat treatment for sealing the encapsulation which simultaneously "bakes out" the encapsulation to inherently assure improved long time electrical stability.

A better understanding of the invention and its further objects and features may be had from the following detailed description taken in connection with the drawing, in which.

Figure 6:
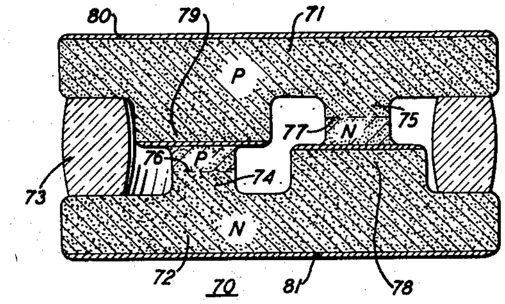
Figure 7:
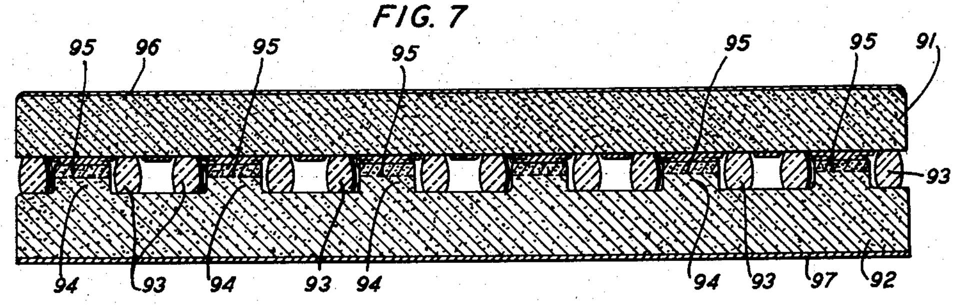
Figure 8:
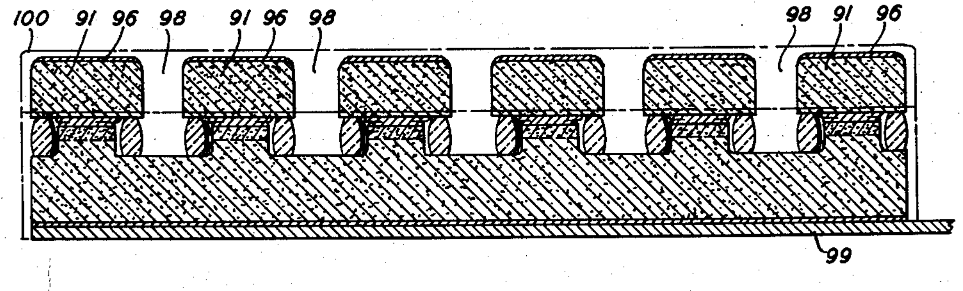
Figure 9:
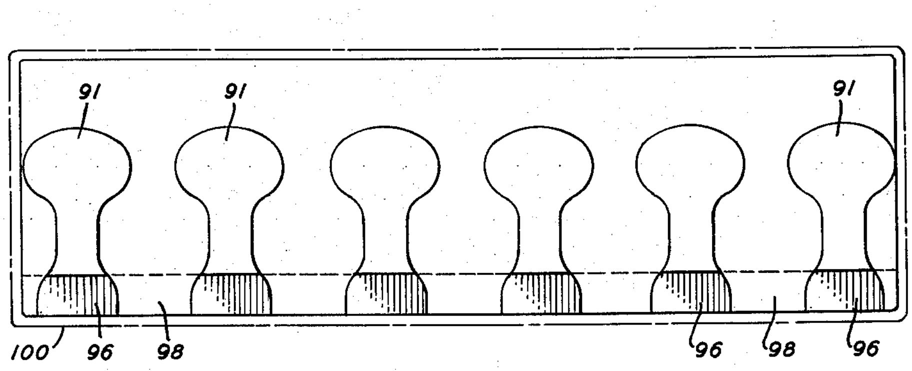

FIG. 6 is another cross sectional view showing the use of the structure of this invention for making a back-to-back diode for surge protection in telephone circuits; and FIGS. 7, 8, and 9 illustrate the application of the invention to a multiple diode arrangement, FIG. 7 showing in cross section a preliminary assembly stage for such a device, FIG. 8 showing a completed device in cross sectional elevation view, and FIG. 9 showing the completed device in plan view.

Figure 1:
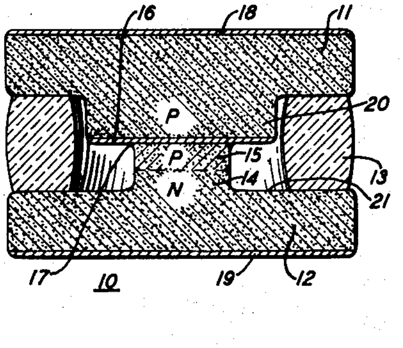
FIG. 1 shows in cross section a p-n junction diode fabricated in accordance with this invention.
Figure 2:
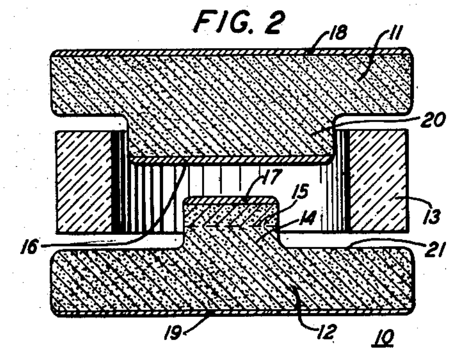
FIG. 2 shows the diode of FIG. 1 with the individual parts of the device in their relationship prior to assembly and also in cross section.

Turning to FIG. 1, there is shown a p-n junction diode 10 comprising a cap member 11 of p-type single crystal silicon semiconductor material, a wafer member 12 of single crystal silicon material predominantly of n-type conductivity, and an insulating glass washer member 13 sealed between the members 11 and 12. The wafer member 12 has on its inner face 21 a raised portion or mesa 14 which includes a p-n junction 15 indicated by the broken line. The inner face 16 of the cap member 11 and the top surface 17 of the mesa are plated with suitable metal electrodes, as are the outer faecs 18 and 19 of the cap 11 and wafer 12, respectively. This can be seen clearly in FIG. 2 where the parts of the device are separated to show their arrangement just prior to final assembly.

The fabrication of this device represents almost the ultimate in simplicity. Single crystal silicon material is prepared in slice form by techniques which now are well known in the art. Such slices are prepared of the proper resistivity and with suitable surfaces and thickness, typically .13 ohm-centimeter n-type, 0.5 inch diameter, and 30 mils thick. The slice from which the wafer 12 is to be fabricated is subjected to a diffusion heat treatment using a significant impurity to produce a p-n junction at a prescribed distance from one surface. Specifically, the lower or major portion of the wafer is of n-type conductivity silicon. A p-type impurity such as boron is diffused into one face of the slice to convert a surface portion thereof to p-type conductivity to a depth typically of 1.5 mils. The particular technique for plating the silicon material is not critical and techniques such as cathode sputtering, evaporation deposition, and electrical or chemical plating may be used. One advantageous method is first to apply a nickel plating by an electroless method in two steps with an intervening heat treatment, generally in accordance with the process disclosed in U.S. Patent No. 2,793,420. Following the application of a nickel coating a gold plating is applied by evaporation deposition. The advantage of this particular process is that the nickel plating serves to inhibit deep alloying of the gold during subsequent heating operations. A plurality of mesas then are produced on this diffused face of the slice by selective etching or, more conveniently by ultrasonic cutting. This step results in a slice of silicon having on one surface a plurality of the mesas 14 each containing a diffused p-n junction 15 therein. As a next step, the individual wafers are then cut out of the slice likewise either by etching or by ultrasonic cutting. Typically, for computer diode applications the wafer is about 30 mils in diameter. In a generally similar fashion the silicon cap member 11 is produced, omitting however, the diffusion heat treatment since the cap member 11 does not include, in this form of the device, a p-n junction. The larger raised portion or mesa 20 of the cap member 11 is provided for devices in which parasitic capacitance is a matter of concern and typically for diodes used in electronic computer or other logic applications. Ideally, from a capacitance standpoint, the mesa of the cap member would be the same diameter of the mesa for the wafer member. However, to facilitate and simplify assembly operations, and particularly for ease of alignment, the mesa of the cap member conveniently is made somewhat larger without deleteriously increasing unwanted capacitance. A small ring of hard glass, advantageously Corning 7052 glass, is placed between the peripheral portions of the two wafers and the assembly is then heated on a strip heater or in an oven to a temperature sufficient to hermetically seal the glass to both wafers. During heat treatment there is a sufficient decrease in the height of the glass member to insure contact between the top surface electrode 17 of the mesa 14 and the inner face electrode 16 of the cap member. At the sealing temperature of about 800° centigrade these two gold-plated surfaces are bonded intimately.

This latter assembly step may be performed either as a single step or two-step process. In the two-step process the seal between the silicon cap member 11 and the glass washer 13 is made by first stacking the washer on the cap and heating both on a strip heater to produce the seal. Typically, for silicon and Corning 7052 hard glass the sealing temperature is about 800° centigrade which is held for about five seconds. This temperature and time is determined largely by the necessity of staying below a temperature at which deleterious alloying of the contact material will occur. The glass and cap member assembly then is dropped in position on the wafer 12 and the second seal between the wafer and the glass washer is made, likewise on a strip heater at the temperature and for the time mentioned above. This assembly operation is carried out in a controlled atmosphere, for example, commercial nitrogen dried to about 30 parts per million of water vapor, and the parts of the device are carefully cleaned and prebaked before final assembly. An appreciation of the further advantages of the structure of this invention may be had from the realization that the diode illustrated in FIG. 1 may have a diameter of .030 inch and a total thickness of .015 inch. In this form it is particularly suitable for drop-in mounting or soldering to a printed circuit board.

Furthermore, the final high temperature sealing operation described above in connection with final assembly inherently assures the dryness and cleanliness of the completed device. This final "bake out" is regarded as highly advantageous for assuring the long time electrical stability of p-n junction device characteristics.

If the assembly operation is performed in a single step, making both seals simultaneously, the temperature similarly is about 800° centigrade but for a somewhat longer period of about ten seconds.

Figure 3:
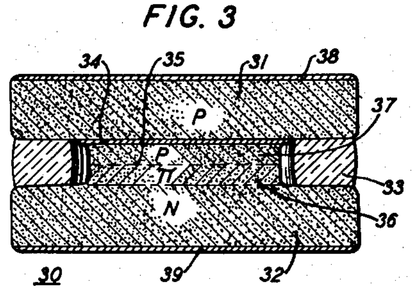
FIG. 3 is a cross sectional view of another embodiment of the invention showing a large area p-n junction diode.
Figure 4:
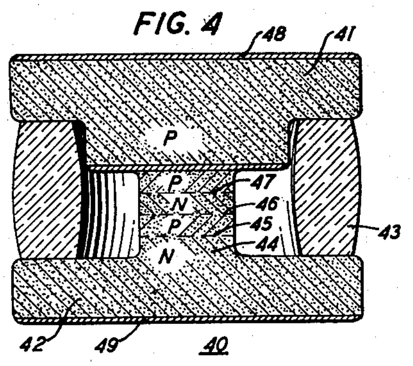
FIG. 4 shows in cross section another embodiment of the invention involving a p-n-p-n diffused junction diode.

The remaining figures of the drawing illustrate other forms of p-n junction diodes utilizing the same basic structure described above in connection with the device of FIG. 1. Basically, any known p-n junction arrangement can be incorporated in the mesa structure. FIG. 3 shows a large area p-n junction diode having a wafer 32 and a large area mesa 34 containing a p-n junction 35. In accordance with a well-known arrangement for power diodes of this type, a zone 36 of high resistivity, substantially intrinsic, material is interposed between the p-type conductivity region 37 and the n-type material. This *i* region of the p-*i*-n diode, in accordance with one method, is the original starting material into which boron and phosphorus have been diffused from opposite sides to produce the surface p- and n-type conductivity regions. Alternatively, as is also known in the art, a layer of high resistivity material may be grown epitaxially on the surface of a slice of n-type material and a shallow region of p-type material may be produced in the surface of the epitaxial zone by diffusion. Structures of this particular type are disclosed in U.S. Patent No. 2,790,940. In this type of diode capacitive reactance is a relatively unimportant factor and, therefore, the cap member 31 of semiconductor material need not have a mesa. Typically, a diode of this type is mounted with the outer face electrode 39 bonded to a metal base in order to provide for enhanced dissipation of heat generated by large currents passing through the device. The relative closeness of the p-n junction in this device to such a heat sink facilitates thermal dissipation. The multiple junction diode shown in FIG. 4 illustrates the adaptation of the basic encapsulation structure to another type of semiconductor diode. In this form of diode the mesa portion 44 of the wafer 42 contains three p-n junctions, 45, 46, and 47, which define four regions of alternate conductivity type within the wafer. Techniques for providing such regions of alternate conductivity type within the mesa by diffusion are well known. In other respects this p-n-p-n diode is similar to the basic device illustrated in FIG. 1.

Figure 5:
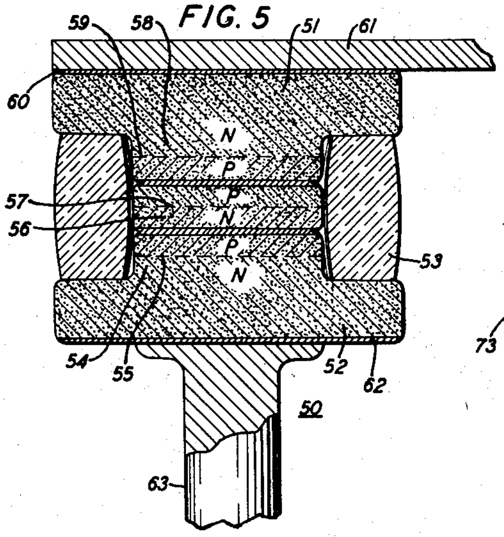
FIG. 5 is a cross sectional view of another embodiment illustrating the use of an additional, separate semiconductor wafer for making a high-voltage breakdown, temperature-compensated diode and illustrating two arangements for attachment of external leads.

FIG. 5 illustrates another form of multiple junction diode in which an additional silicon semiconductor wafer 56 including a p-n junction is sandwiched between the wafer 52 and cap member 51. In this structure the wafer and cap members 52 and 51, respectively, may be similar in that both contain diffused p-n junctions 55 and 59, respectively. However, the junction 59 of the cap member 51 may differ substantially in its impurity concentration gradient inasmuch as it is included solely to provide temperature compensation with change in voltage. Thus the structure is a temperature-compensated junction diode with two serially arranged blocking rectifiers for increasing the breakdown voltage of the unit. The conductivity type of the several regions will be as labeled in the figure. For purposes of illustration and by way of example, two structural arrangements for attaching external leads to self-encapsulated diodes are shown. These or similar arrangements may be used in applications where such leads are desirable. A metallic tab member 61 is shown bonded to the outer face electrode 60 of the cap member 51. The opposite electrode has attached thereto a lead 63 which may be a gold or aluminum wire having a nail head or upset end portion which is bonded to the gold plated outer face 62 of the wafer member 52.

FIG. 6 is an arrangement for self-encapsulating a pair of parallel connected, opposed p-n junction diodes commonly used for surge protectors or in telephone parlance, click reducers. In the arrangement of FIG. 6 the silicon cap member 71 is identical to the wafer member 72 except as to the polarities of the respective conductivity type regions. As shown in the figure, the wafer member 72 is predominantly of n-type material with a diffused p-type conductivity region in the upper portion of the mesa 74. Conversely, the cap member 71 is predominantly of p-type material with a small n-type region diffused into the top of the mesa 75. Both wafer and cap member may be produced in multiples from single slices of silicon using masking and diffusion techniques. Thus, by bonding the two members together in contacting relation, the result is an n-p and a p-n diode in parallel electrical relation in a single encapsulation.

FIGS. 7, 8, and 9 illustrate a multiple diode structure of the type used in certain logic circuit applications. FIG. 7 illustrates an intermediate form of the device as assembled for the heat sealing step during fabrication while FIGS. 8 and 9 show, in cross section and plan views, respectively, the final form of the device.

As shown in FIG. 7, a wafer member 92 has formed on one face a series of mesas 94 each containing a p-n junction 95. Surrounding each round mesa is a glass member 93 which is sealed to a cap piece 91 and to the wafer 92. This step results also in placing the top face of each mesa in contact with the cap piece 91. After the heat sealing operation, a mask is applied to the top surface 96 of the cap member 91. This surface 96, which is nickel and gold plated to provide an ohmic electrode, then is etched selectively so as to separate the respective upper electrodes of the several separate diodes. Thus, as shown in FIG. 8, a separation 98 is formed between each of the upper portions of the diodes. As shown in FIG. 9, the etched out form may be likened to a dumbbell shape with the exposed portions 96 constituting the separate electrodes for each of the multiple diodes. This particular dumbbell shape is employed in this multiple diode in order to decrease the capacitance between the upper and lower members by decreasing the area. Multiple arrangements of this kind for other applications in which this capacitance is not a problem may use shapes which facilitate or simplify the fabrication process. The common electrode is the lower face 97 to which is attached a tab lead 99. For mechanical protection if desirable, a potting compound or the like may be applied over the structure as represented by the broken line boundary 100 which leaves exposed only the portions 96 of the upper electrodes and the common electrode 99. Although the specific disclosure has been in terms of p-n diffused junctions, it will be understood that the encapsulation arrangement described may be employed likewise with devices using grown, alloyed or other types of p-n junctions. Furthermore, it will be obvious that although particular polarities of conductivity type materials are shown, these may be reversed if desired for any reason. Moreover, in those devices in which the cap member does not include a p-n junction, the material may be polycrystalline rather than single crystal, if desired.

Moreover, although the invention has been disclosed, particularly in reference to the use of silicon semiconductor material, it will be understood that it may similarly be applied to other semiconductor materials such as germanium and group III–V compounds. In this connection the important factor is to secure as close as possible a correspondence in the thermal coefficients of the materials being sealed together.

Although the invention has been described in terms of certain specific embodiments, it will be appreciated that other arrangements may be devised by those skilled in the art which will be within the scope and spirit of the invention.

What is claimed is:

1. An encapsulated semiconductor p-n junction diode comprising a wafer and a cap member of semiconductor material and an insulating member sealed to and between the peripheral portions of said wafer and said cap member, said wafer member having a mesa on its inner face, said mesa including a p-n junction, the outer faces of said wafer and said cap member having ohmic electrodes thereon, said wafer and said cap member being in electrical contacting relationship with each other thereby providing a semiconductive path from one outer face electrode to the other outer face electrode.

2. An encapsulated semiconductor p-n junction diode comprising a wafer of semiconductor material having an inner and an outer face, said wafer having an ohmic electrode on said outer face and a mesa on said inner face, said mesa including a p-n junction substantially parallel to said faces, a cap member of semiconductor material having an inner and an outer face, said cap member having an ohmic electrode on said outer face, an insulating member sealed to and between the peripheral portions of the inner faces of said wafer and cap member, said wafer and cap member being in electrical contacting relationship with each other thereby providing a semiconductive path from one outer face electrode to the other outer face electrode.

3. A completely encapsulated semiconductor p-n junction diode comprising a silicon wafer having an inner and an outer face, said wafer having a plated metal ohmic electrode on said outer face and a mesa on said inner face, said mesa including a p-n junction substantially parallel to said faces, a cap member of silicon semiconductor material having an inner and an outer face, said cap member having a plated metal ohmic electrode on said outer face, a glass insulating member sealed to and between the peripheral portions of the inner faces of said wafer and said cap member, plated metal electrodes on the top surface of said mesa portion and the inner face of said cap member, said mesa electrode and said inner face electrode being in physical and electrical contact with each other.

4. A completely encapsulated semiconductor p-n junction diode in accordance with claim 3 in which said cap member includes on its inner face a mesa.

5. An encapsulated semiconductor p-n junction diode in accordance with claim 4 in which the mesa of said cap member includes a p-n junction.

6. An encapsulated semiconductor p-n junction diode in accordance with claim 3 in which said mesa of said wafer includes more than one p-n junction.

7. An encapsulated semiconductor p-n junction diode in accordance with claim 3 in which said semiconductive path between said wafer and said cap member includes a separate semiconductive wafer which includes a p-n junction bonded to and between said cap member and said wafer in ohmic contact therewith.

8. An encapsulated semiconductor p-n junction diode in accordance with claim 3 in which both said cap member and said wafer member include more than one mesa on their inner faces, at least one mesa of both the cap member and the wafer member including a p-n junction.

9. A completely encapsulated semiconductor p-n junction diode comprising a wafer of silicon semiconductor material having an inner and an outer face, said wafer having an ohmic electrode on said outer face and a pair of mesas on said inner face, one of said mesas including a p-n junction, a cap member of silicon semiconductor material and an inner and an outer face, said cap member having an ohmic electrode on said outer face, one of said mesas of said cap member including a p-n junction, a glass insulating member sealed to and between the peripheral portions of the inner faces of said wafer and cap member, said mesas of said wafer member being in physical and electrical contact with the mesas of said cap member whereby the junction containing mesa of one member is in physical and electrical contact with the non-junction containing mesa of the other member, respectively.

10. A completely encapsulated array of semiconductor p-n junction diodes comprising a wafer of semiconductor material having an inner and an outer face, said wafer having an ohmic electrode on said outer face and a plurality of mesas on said inner face, each said mesa including a p-n junction substantially parallel to said faces, a plurality of cap members of semiconductor material each having an inner and an outer face, each said cap member having an ohmic contact on said outer face, a plurality of glass insulating members sealed to and between the peripheral portions of the inner face of said cap members and the portion of the inner face of said wafer member surrounding each of said mesas, the top surface of each said mesa being in physical and electrical contact with the inner face of each said cap member.

References Cited in the file of this patent

UNITED STATES PATENTS

| | | |
|---|---|---|
| 2,863,105 | Ross | Dec. 2, 1958 |
| 2,921,245 | Wallace et al. | Jan. 12, 1960 |
| 2,972,092 | Nelson | Feb. 14, 1961 |